United States Patent [19]
Tamaki et al.

[11] Patent Number: 5,316,610
[45] Date of Patent: May 31, 1994

[54] BONDING APPARATUS

[75] Inventors: Tomohiro Tamaki; Kenzo Hatada; Hiroaki Fujimoto, all of Osaka; Yoshinobu Takeshita, Kagoshima, all of Japan

[73] Assignees: Matsushita Electric Industrial Co., Ltd.; Matsushita Electronics Corporation, Osaka, Japan

[21] Appl. No.: 992,909

[22] Filed: Dec. 18, 1992

[30] Foreign Application Priority Data

Dec. 26, 1991 [JP] Japan .................. 3-344303

[51] Int. Cl.⁵ .................. B27G 11/02; B31F 5/04; B32B 31/24
[52] U.S. Cl. .................. 156/379.6; 29/729; 29/739; 29/740
[58] Field of Search .............. 156/379.6, 379.8, 273.7, 156/275.5, 275.7, 273.5; 29/25.01, 740, 842

[56] References Cited

U.S. PATENT DOCUMENTS

| | | | |
|---|---|---|---|
| 3,531,852 | 10/1970 | Slemmons et al. | 29/470.1 |
| 4,603,803 | 8/1986 | Chan et al. | 228/4.5 |
| 4,749,120 | 6/1988 | Hatada | . |
| 5,037,780 | 8/1991 | Fujimoto et al. | 437/212 |
| 5,115,545 | 5/1992 | Fujimoto et al. | 29/25.01 |
| 5,173,147 | 12/1992 | Shimoyama et al. | 156/379.6 |

FOREIGN PATENT DOCUMENTS

| | | |
|---|---|---|
| 4131413 | 10/1992 | Fed. Rep. of Germany . |
| 62-252946 | 11/1987 | Japan . |
| 62-281360 | 12/1987 | Japan . |
| 2-7180 | 2/1990 | Japan . |
| 3-4546 | 1/1991 | Japan . |

Primary Examiner—David A. Simmons
Assistant Examiner—M. Curtis Mayes
Attorney, Agent, or Firm—Willian Brinks Olds Hofer Gilson & Lione

[57] ABSTRACT

A depression jig, having a depression chip and a holder for holding the depression chip, is provided which depresses against a wiring substrate a semiconductor chip placed on the wiring substrate. The holder has portions defining penetrations vertically running through the holder. Optical fibers are inserted into the penetrations. A light ray radiates from the optical fiber. The light ray is incident upon the top surface of the depression chip, enters the depression chip, is reflected from a side surface of the depression chip onto the undersurface of the depression chip, and is emitted from the undersurface of the depression chip as an outgoing light ray. A photo-curing resin supplied between the semiconductor chip and the wiring substrate is irradiated with such an outgoing light ray, so that the photo-curing resin hardens.

8 Claims, 7 Drawing Sheets

BONDING APPARATUS

BACKGROUND OF THE INVENTION

This invention generally relates to bonding apparatus for mounting semiconductor chips with many, low-pitch projecting electrodes (i.e., bumps) onto a wiring substrate at high density. More specifically, it pertains to a bonding apparatus for bonding such semiconductor chips onto an opaque wiring substrate formed of such materials as silicon or ceramic by means of what is known in the semiconductor industry as "facedown bonding".

In the art, there is a bonding method known as the MBB (micro bump bonding) method in which a semiconductor chip having on its undersurface many, low-pitch bumps is mounted onto a wiring substrate having on its top surface wires so that a batch wireless bonding can be accomplished by means of the facedown bonding.

FIG. 5 illustrates a bonding apparatus of the MBB method. This bonding apparatus includes a mounting stand 2, a depression jig 4, a pressurizer 5, and several optical fibers 6. Placed onto the mounting stand 2 is a wiring substrate 1 of such materials as silicon or ceramic, the wiring substrate 1 having wires on its top surface. The depression jig 4 is used to depress against the wiring substrate 1 a semiconductor chip 3 with bumps 3a on its undersurface, the semiconductor chip 3 being set in place on the wiring substrate 1 that is placed on the mounting stand 2. The pressurizer 5 is disposed above the depression jig 4 and is used to push down the depression jig 4. The optical fibers 6, disposed alongside the depression jig 4, send out respective light rays upon a photo-curing resin (i.e., the resin which hardens on application of light) supplied between the wiring substrate 1 and the semiconductor chip 3. The mounting stand 2 is mobile, which facilitates the alignment of the semiconductor chip 3 with the wiring substrate 1, in bonding these two elements together. The depression jig 4 has a holder 7 and a depression chip 8. The depression chip 8 is made of hard metal, ceramic, or the like materials, and is jointed to the undersurface of the holder 7. The top surface of the holder 7, indicated by the reference numeral 7a, is jointed to the pressurizer 5.

FIGS. 6(a)-(d) shows shows how such a bonding apparatus mounts the semiconductor chip 3 onto the wiring substrate 1.

As shown in FIG. 6a, the wiring substrate 1, with its top surface up, is placed onto the mounting stand 2. Then, the top surface of the wiring substrate 1 is coated with a photo-curing resin 9 having the property of insulation. The wire 1a is of such materials as Cr, Au, Al, Cu, or like materials. The bump 3a, on the other hand, is of such materials as Au, Al, Cu, or like materials. For the photo-curing resin 9, such materials as ultra violet ray-curing epoxy resin, silicon resin, acrylic resin, or the like materials may be employed.

As shown in FIG. 6b, the semiconductor chip 3 is set in place on the wiring substrate 1, with the bump 3a of the semiconductor chip 3 aligned with the wire 1a of the wiring substrate 1 as well as with the photo-curing resin 9 disposed between the semiconductor chip 3 and the wiring substrate 1.

As shown in FIG. 6c, the downward movement of the pressurizer 5 causes the depression jig 4 to press the semiconductor chip 3 downward, whereby the semiconductor chip 3 is pressed against the wiring substrate 1. The photo-curing resin 9 lying between the bump 3a and the wire 1a therefore extrudes from between the bump 3a and the wire 1a. As a result, the bump 3a is brought into electrical contact with the wire 1a.

Thereafter, the optical fibers 6 simultaneously send out respective ultra violet rays upon the photo-curing resin 9, with the semiconductor chip 3 pressed onto the wiring substrate 1, whereby the photo-curing resin 9 hardens on application of the ultra violet rays. In other words, while making reflection and scattering between the undersurface of the semiconductor chip 3 and the top surface of the wiring substrate 1, the ultra violet rays enter the photo-curing resin 9 to harden it.

The several optical fibers 6 are provided around the depression jig 4, the reason for which is that the photo-curing resist 9 around the semiconductor chip 3 cannot simultaneously be hardened by only one optical fiber. If the optical fiber 9 is to be disposed outside every side of the semiconductor chip 3, this requires four optical fibers. If the optical fiber 9 is to be disposed outside every side and corner of the semiconductor chip 3, this requires eight optical fibers.

As shown in FIG. 6d, the pressurizer 5 has moved away from over the semiconductor chip 3.

The semiconductor chip 3 is now firmly fixed to the wiring substrate 1, and the bump 3a of the semiconductor chip 3 is brought into electrical contact with the wire 1a of the wiring substrate 1 due to shrinkage force of the photo-curing resin 9.

As shown in FIG. 7a, if there is a great space (i.e., the width W1) between a semiconductor chip 3A being depressed with the depression jig 4 and its neighboring semiconductor chip 3B, the optical fiber 6 is able to send out ultra violet rays through such a great space upon the photo-curing resin 9. A tilt angle, $\theta$, formed between an ultra violet ray emitted from the optical fiber 6 and one side face of the semiconductor chip 3A, is determined based on the efficiency of the hardening of the photo-curing resin 9 (FIG. 7a).

As shown in FIG. 7b, if the semiconductor chip 3A and the neighboring semiconductor chip 3B are mounted in close proximity, that is, if there is a close space (the width W2) between these two semiconductor chips, some ultra violet rays, given off from the optical fiber 6, are interfered with due to the presence of the neighboring semiconductor chip 3B. This presents a problem in that the efficiency of the irradiation relative to the photo-curing resin 9 lying around the semiconductor chip 3A decreases.

As shown in FIG. 7c, a depression surface 8a (i.e., the undersurface of the depression chip 8) is generally given a slightly greater area compared to the semiconductor chip 3 so that even though the relative positions of the depression jig 4 and the semiconductor chip 3 deviate, the depression surface 8a of the depression chip 8 can manage to equally depress the semiconductor chip 3. This, however, presents another problem in that some ultra violet rays, given off from the optical fiber 6, are interfered with by the depression surface 8a the area of which is greater than that of the semiconductor chip 3. This results in the decrease of the efficiency of the irradiation relative to the photo-curing resin 9.

SUMMARY OF THE INVENTION

The present invention was made to solve the foregoing problems. In accordance with the invention, the depression chip is formed of a light ray transmission material through which light rays can pass. Outgoing light rays, given off from the optical fiber, are so directed that they are incident upon the top surface of the depression chip, thereby entering the depression chip and being reflected from the side surfaces of the depression chip. Then such light rays are sent out from the undersurface of the depression chip upon the photo-curing resin.

The invention discloses a bonding apparatus which comprises: a mounting stand onto which a wiring substrate with wires on its top surface is placed; a depression jig for depressing against the wiring substrate a semiconductor chip with bumps on its undersurface, the semiconductor chip being set in place on the wiring substrate that is placed on the mounting stand; a pressure means for pressurizing the depression jig downward; and light feed means for sending out light rays upon a photo-curing resin having the property of insulation, the photo-curing resin lying between the wiring substrate and the semiconductor chip. The depression jig includes a depression chip of a light ray transmission material, and a holder for holding the depression chip. The holder has portions defining penetrations that vertically run through the holder, whereby light rays, given off from the light feed means, can pass through the penetrations from upward to downward. The top surface of the depression chip is flat, which serves as an incident surface upon which the light rays, which have passed through the penetrations, are incident, while on the other hand, the undersurface of the depression chip is also flat, which serves as a depression surface to depress the semiconductor chip against the wiring substrate. The side surfaces of the depression chip serve as reflective surfaces so that the incident light rays, which were incident upon the incident surface and have entered inside, are reflected from the reflective surfaces onto the depression surface. To sum up, the light feed means harden the photo-curing resin by sending out light rays which fall upon the incident surface of the depression chip, enter the depression chip, are emitted out of the depression surface, and finally reach the photo-curing resin.

As described above, in accordance with the invention, a light ray for hardening the photo-curing resin strikes the incident surface of the depression chip, enters inside, is reflected from the reflective surface onto the depression surface, and is emitted out of the depression surface. As a result, the light ray is diagonally sent out upon the photo-curing resin. With this arrangement, even though there is a close space between one semiconductor chip and its neighboring semiconductor chip, that is, they are mounted at a high density, the light rays positively reach the photo-curing resin. This prevents the efficiency of the irradiation relative to the photo-curing resin from decreasing.

Additionally, since the light rays for hardening the photo-curing resin are emitted from the depression surface of the depression chip of a light ray transmission material, the light rays can make their way to the photo-curing resin without any obstacles, while on the other hand, the light rays are interfered with in the prior art technique due to the conventional depression chip which is made of a non-light ray transmission material. Thus, the efficiency of the irradiation relative to the photo-curing resin will not decrease in the present invention.

The depression surface of the depression chip can advantageously be greater than the semiconductor chip without suffering from ill effects, since the depression chip no longer blocks the course of the light rays. This allows the depression surface of the depression chip to positively depress the semiconductor chip even though the relative positions of the depression chip and the semiconductor chip deviate.

Further, if an angle, formed between the depression surface and each reflective surface of the depression chip, is made obtuse, this causes a light ray, given off from the light feed means, to fall upon the incident surface of the depression chip at a right angle. This results in simplifying the arrangement of the light feed means.

A light ray, which is incident upon the incident surface of the depression chip, enters the depression chip and is fully reflected from the reflective surface onto the depression surface, if the incident surface and the depression surface of the depression chip are in a parallel relationship with each other, and if the relation of sin $\alpha > n_2/n_1$ holds where $\alpha$ is the angle formed between the depression surface and the reflective surfaces of the depression chip, $n_1$ is the index of refraction of light relative to the light ray transmission material making up the depression chip, and $n_2$ is the index of refraction of light relative to a layer outside the depression chip. This improves the efficiency of the irradiation relative to the photo-curing resin.

Each light ray, which is incident upon the incident surface of the depression chip, enters inside and is reflected from the reflective surface, reaches the depression surface, if one side of the depression surface of the depression chip is longer than one side of the semiconductor chip by a given length, if the other sides of the depression surface are longer than the other sides of the semiconductor chip by the aforesaid given value, respectively, and if the relation of $L \geq 2t/\tan \beta$ holds (L: the given value; t: the thickness of the semiconductor chip; and $\beta$: the angle formed between the depression surface and an outgoing light ray emitted from the depression surface). This also improves the efficiency of the irradiation relative to the photo-curing resin.

It is preferable that the light feed means sends out ultra violet rays, and that the light ray transmission material is an ultra violet ray transmission material such as quartz glass.

If the light feed means comprises optical fibers, it facilitates the feed of light rays.

The holder is provided with portions defining four penetrations in a square formation. The corresponding optical fibers are inserted into the penetrations and send out respective light rays that produce uniform hardening of the Photo-curing resin lying between the semiconductor chip and the wiring substrate.

If the optical fiber is mobile horizontally, this facilitates the correction of the light ray emitting position of the optical fiber when an error occurs.

If the optical fiber is mobile vertically, the incident efficiency of the light rays, given off from the optical fiber, to the incident surface of the depression chip can be adjusted.

DETAILED DESCRIPTION OF THE INVENTION

A Preferred embodiment of the invention is now described by reference to the accompanying drawings.

Figure 1A:
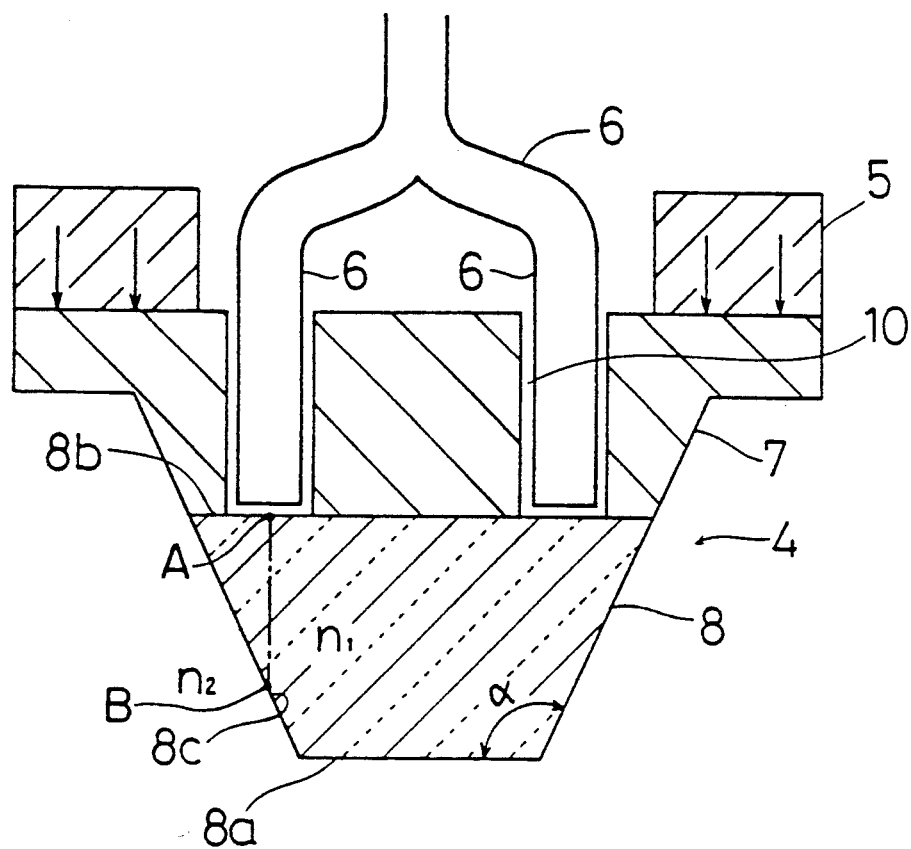
FIGS. 1(a)-1(b) shows in cross section the organization of a bonding apparatus of an embodiment of the present invention.
Figure 1B:
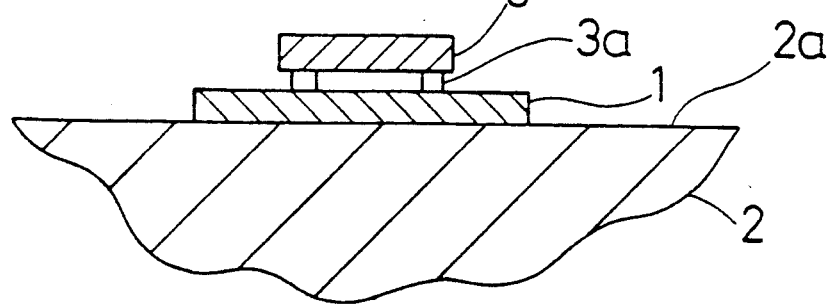

A bonding apparatus in accordance with the invention, shown in FIGS. 1(a)–1(b) comprises a mounting stand 2, a depression jig 4, and a pressurizer 5. Placed onto the mounting stand 2 is a wiring substrate I of such materials as silicon or ceramic. The wiring substrate 1 has on its top surface wires. The depression jig 4 is used to depress against the wiring substrate 1 a semiconductor chip 3 with bumps 3a on its undersurface, the semiconductor chip 3 being set in place on the wiring substrate 1 that is placed on the mounting stand 2. The pressurizer 5 is disposed above the depression jig 4 and pushes down the depression jig 4. The mounting stand 2 has a flat placement surface 2a onto which the wiring substrate 1 is placed, and is mobile horizontally thereby making it possible to align the wiring substrate 1, placed on the placement surface 2a, with the semiconductor chip 3, in bonding these two element together.

The depression jig 4 comprises a holder 7, fixed to the undersurface of the pressurizer 5 and having a rectangular undersurface, and a depression chip 8 of a light ray transmission material, fixed to the undersurface of the holder 7 with adhesives.

Provided in the holder 7 are portions defining four penetrations 10 in a square formation. Each one of the four penetrations 10 vertically runs through the holder 7, and corresponding four optical fibers 6, serving as light feed means for sending out ultra violet rays, are inserted from upward to downward into these four penetrations 10.

The depression chip 8, of such ultra violet ray transmission materials as quartz glass, is of a frustum of a pyramid. The depression chip 8 has an incident surface 8b that is a flat rectangular top surface upon which light rays sent out from the optical fibers 6 are incident, a depression surface 8a that is a flat rectangular undersurface parallel with the incident surface 8b, and reflective surfaces 8c that are flat side surfaces so that light rays that are incident upon the incident surface 8b and enter inside are reflected from the reflective surfaces onto the depression surface 8a. The sides of the depression surface 8a are longer than the corresponding sides of the semiconductor chip 3.

To sum up, the outgoing light rays, given off from the optical fibers 6, are incident upon the incident surface 8b of the depression chip 8 thereby entering inside. Then, the light rays are reflected from the respective reflective surfaces 8c onto the depression surface 8a, and are emitted from the depression surface 8a so that the side faces of the semiconductor chip 3 are irradiated with the light rays. The provision of the four penetrations 10 in the holder 7 arranged in a square formation makes it possible for the side faces of the semiconductor chip 3 to be irradiated with the light rays at the same time.

An angle, $\alpha$, formed between the depression surface 8a and each reflective surface 8c of the depression chip 8, is obtuse, and the relation of $\sin \alpha > n_2/n_1$ holds where $n_1$ is the index of refraction of light relative to the light ray transmission material making up the depression chip 8, and $n_2$ is the index of refraction of light relative to a layer outside the depression chip 8. A light ray, which falls upon the incident surface 8b of the depression chip 8 at Point A and enters inside, is reflected from the reflective surface 8c at Point B onto the depression surface 8a without penetrating through the reflective surface 8c. This allows each light ray that is incident upon the incident surface 8b of the depression chip 8 and enters inside to be fully reflected from the reflective surface 8c, which leads to the high efficiency of the irradiation relative to the photo-curing resin. If the depression chip 8 is of a quartz glass, $n_1 = 1.5$, and if the layer outside the depression chip 8 is air, $n_2 = 1.0$. Thus, the angle, $\alpha$, should be set within the range of from 138.3° down to 90°.

Figure 2A:
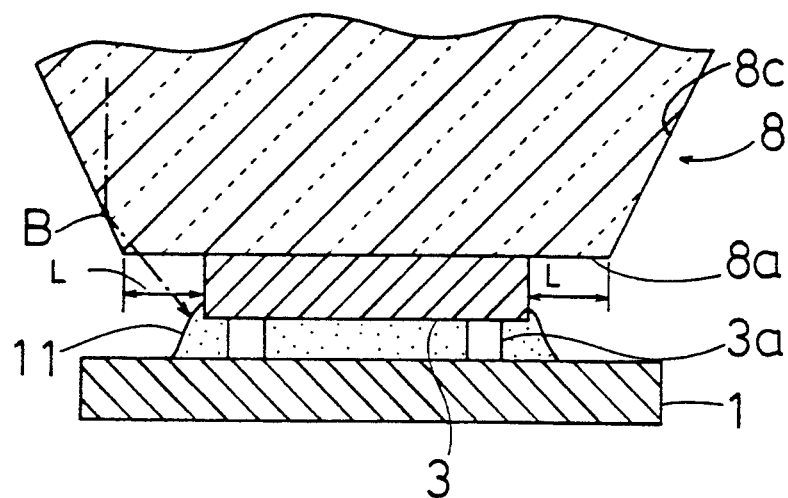
FIGS. 2(a)-2(b) are a cross sectional view illustrating geometrical dimensions of a depression surface of the bonding apparatus of the invention.
Figure 2B:
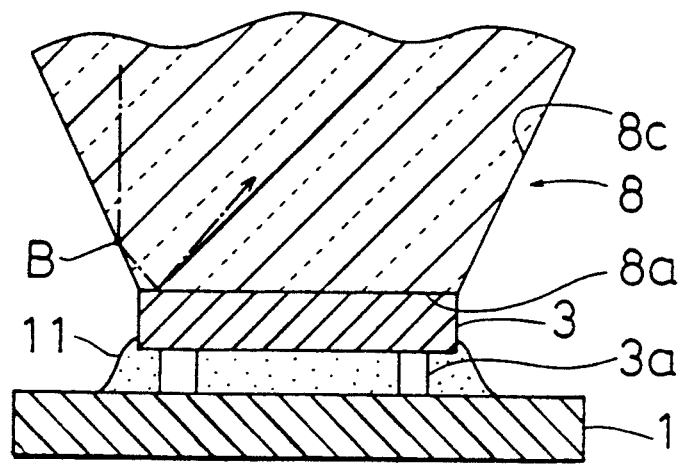

As shown in FIG. 2a, one side of the depression surface 8a of the depression chip 8 is longer than one corresponding side of the semiconductor chip 3 by a given length L, and the other sides of the depression surface 8a are longer than the other corresponding sides of the semiconductor chip 3 by the given length L, respectively. With this arrangement, light- rays are reflected from the reflective surfaces 8c onto the depression surface 8a and are emitted from the depression surface 8a outside the semiconductor chip 3, with no light rays reflected from the top surface of the semiconductor chip 3. If, as shown in FIG. 2b, the size of the depression surface 8a of the depression chip 8 corresponds to that of the semiconductor chip 3, the light rays, reflected from the reflective surfaces 8c of the depression chip 8, are reflected from the top surface of the semiconductor chip 3. Thus, the light rays are not emitted from the depression surface 8a.

Reference is now made to FIGS. 3(a)–3(d) to illustrate how the bonding apparatus of the invention mounts the semiconductor chip 3 onto the wiring substrate 1.

Figure 3A:
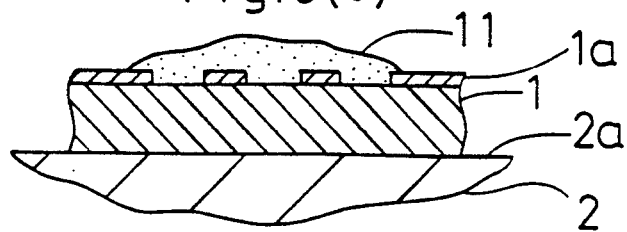
FIGS. 3(a)–3(d) shows in cross section how the bonding apparatus of the invention mounts a semiconductor chip onto a wiring substrate.

As shown in FIG. 3a, the wiring substrate 1 of such materials as silicon or ceramic having on its top surface wires 1a is placed onto the placement surface 2a of the mounting stand 2. The wire 1a is of Au, Cu, Al, or like materials, and has a thickness of approximately $0.1\mu$ to 35 $\mu$m. Thereafter, the top surface of the wiring substrate 1 is coated with a photo-curing resin 9. The photo-curing resin 9 may be formed of epoxy resin, silicon resin, acrylic resin, or like materials with the degree of viscosity ranging from 1000 cp to 5000 cp.

Figure 3B:
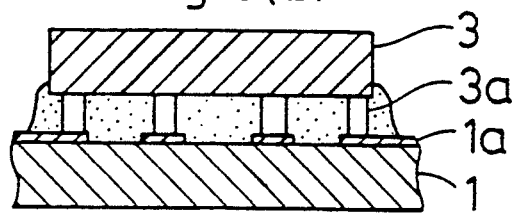

As shown in FIG. 3b, the bump 3a of the semiconductor chip 3 is aligned with the wire 1a of the wiring substrate 1, before placing the semiconductor chip 3 onto the wiring substrate 1.

Figure 3C:
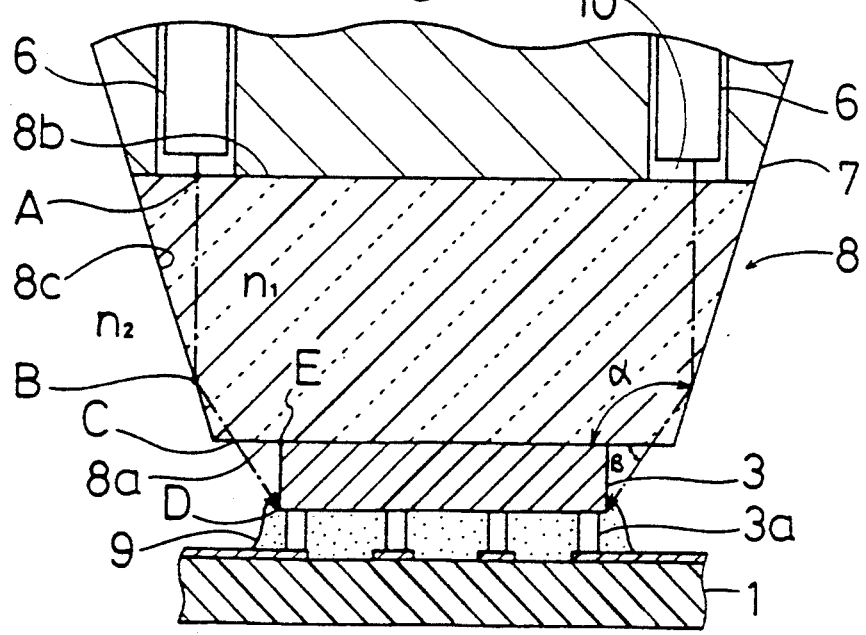

As shown in FIG. 3c, the semiconductor chip 3 is depressed with the depression surface 8a of the depression chip 3 so that the semiconductor chip 3 is pressed onto the wiring substrate 1. As a result of this, the photo-curing resin 9 lying between the bump 3a and the wire 1a extends from between the bump 3a and the wire 1a. Thus, the bump 3a is brought into electrical contact with the wire 1a. Depression force applied by the depression chip 8 to the semiconductor chip 3 to depress it is 10 g to 50 g per bump. Then, with the semiconductor chip 3 pressed against the wiring substrate 1, the optical fibers 6 send out respective ultra violet rays upon the photo-curing resin 9.

The following will describe how an ultra violet ray, given off from the optical fiber 6, reaches the photo-curing resin 9 to harden it.

An outgoing ultra violet ray, given off from the optical fiber 6, is incident upon the incident surface 8b of the depression chip 8 at Point A at a right angle to the incident surface 8b, travels into the depression chip 8, and is fully reflected from the reflective surface 8c at Point B. Thereafter, the ultra violet ray is emitted from the depression surface 8a at Point C at an outgoing angle of $\beta$ to the depression surface 8a. Between the angle $\alpha$ formed between the depression surface 8a and the reflective surface 8c of the depression chip 8 and the outgoing angle $\beta$, there is a relationship by the Snell laws of refraction: $\sin(90° - \beta) = (n_1/n_2 \times \sin(2\alpha - \frac{1}{2}°))$ where $n_1$ is the index of refraction of light relative to the light ray transmission material making up the depression chip 8, and $n_2$ is the index of refraction of light relative to the layer outside the depression chip 8.

The ultra violet ray, thus emitted from the depression surface 8a, falls on the photo-curing resin 9 lying between the semiconductor chip 3 and the wiring substrate 1 thereby hardening the photo-curing resin 9. The four optical fibers 6, inserted into the four penetrations 10 in the holder 7, simultaneously send out respective ultra violet rays so that such ultra violet rays are simultaneously emitted from the depression surface 8a. As a result, the photo-curing resin 9 lying alongside the side faces of the semiconductor chip 3 is simultaneously hardened.

Figure 3D:
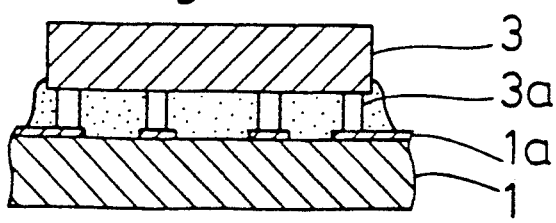

As shown in FIG. 3d, the depression chip 8 is moved away from over the semiconductor chip 3. The semiconductor chip 3 is now firmly fixed to the wiring substrate 1, and the bump 3a of the semiconductor chip 3 establishes electrical contact with the wire 1a of the wiring substrate 1 due to shrinkage force of the photo-curing resin 9.

The relation between the size of the depression surface 8a of the depression chip 8 and the size of the semiconductor chip 3 is now described below. As shown in FIG. 3c, when an ultra violet ray, emitted from the depression surface 8a at Point C, is incident upon the photo-curing resin 9 at Point D, the relation of $\tan \beta = ED/CE$ holds where E is the end of the top surface of the semiconductor chip 3. In other words, if the difference between the length of one side of the depression surface 8a and the length of one corresponding side of the semiconductor chip 3 is L, if the differences between the lengths of the other sides of the depression surface 8a and the lengths of the other corresponding sides of the semiconductor chip 3 are likewise L, respectively, and if the thickness of the semiconductor chip 3 is t, the relation among L, t, and $\beta$ is required to be such that $L \geq 2t/\tan \beta$.

Figure 4A:
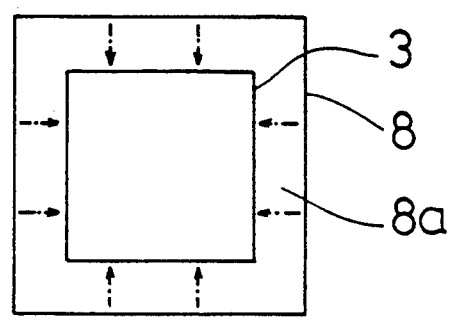
FIGS. 4(a)–4(b) show the arrangement relation of a depression surface of a depression chip versus a semiconductor chip.
Figure 4B:
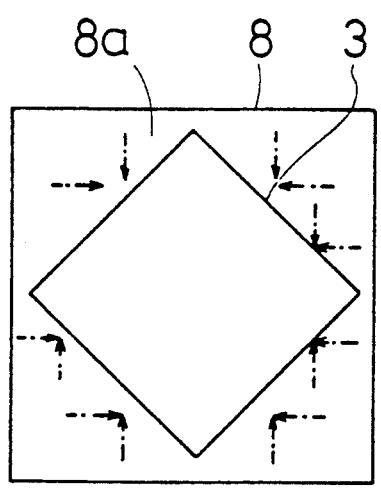
Figure 5:
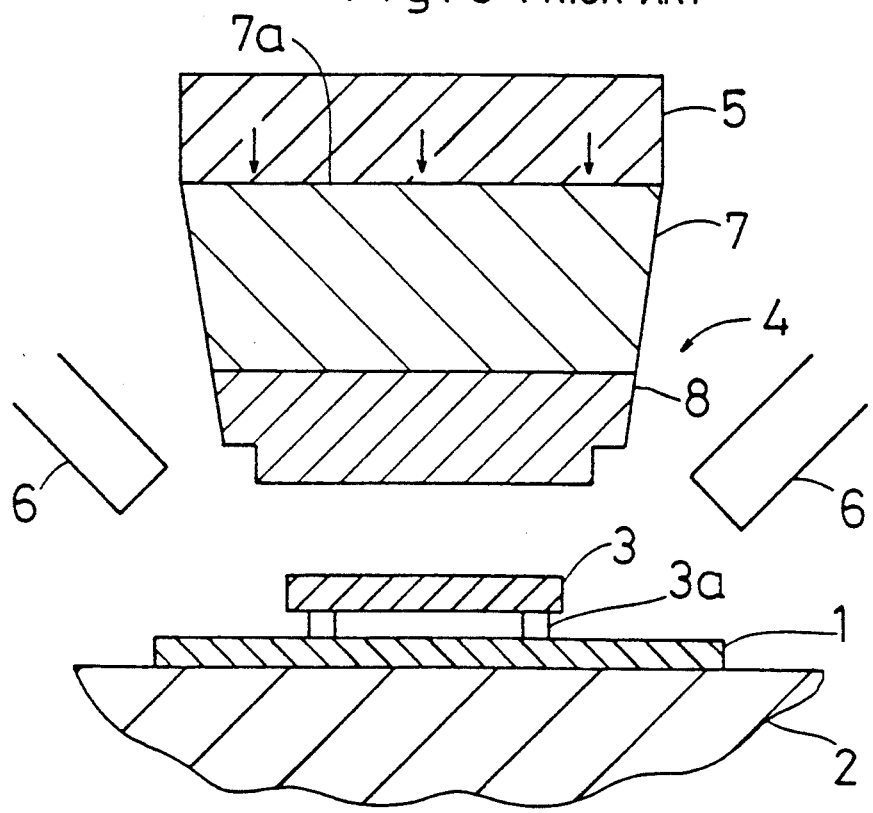
FIG. 5 shows in cross section the organization of a prior art bonding apparatus.
Figure 6A:
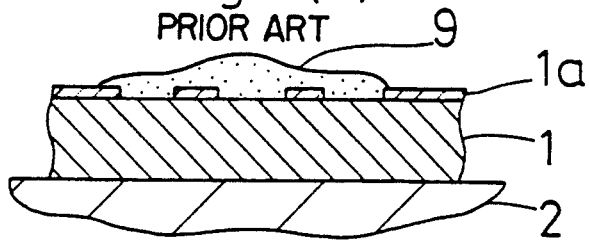
FIGS. 6(a)–6(d) show in cross section how the prior art bonding apparatus mounts a semiconductor chip onto a wiring substrate.
Figure 6B:
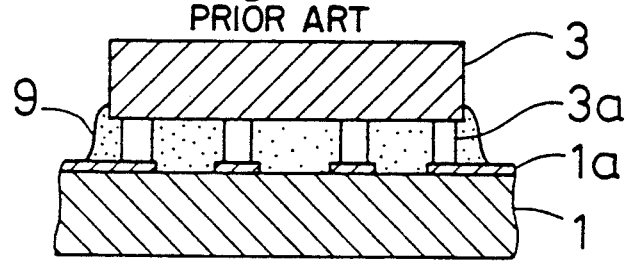
Figure 6C:
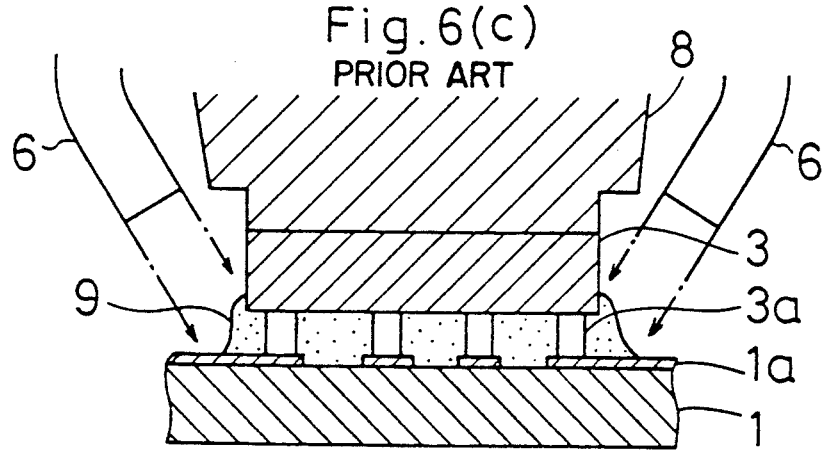
Figure 6D:
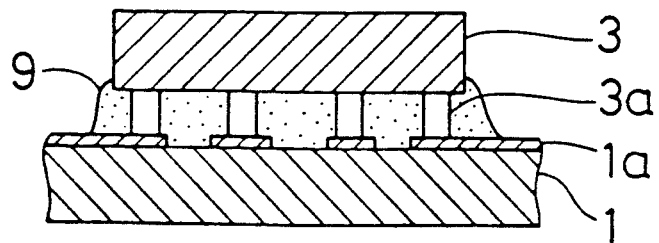
Figure 7A:
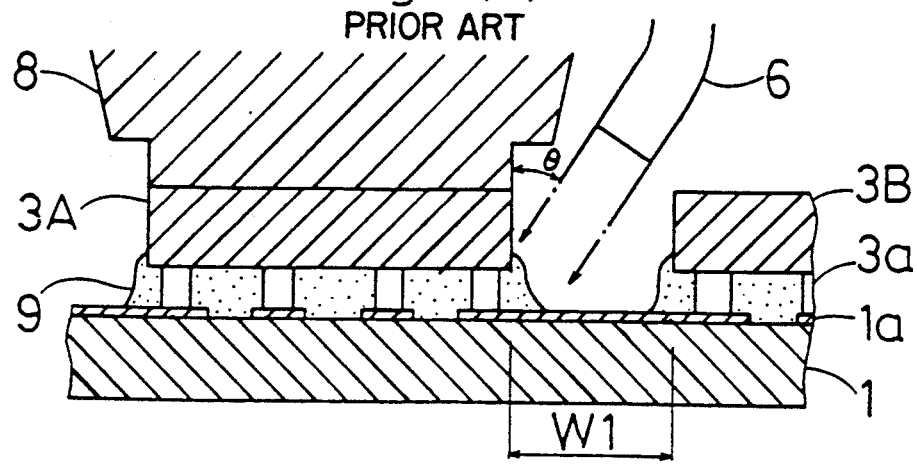
FIGS. 7(a)–7(c) show in cross section how the prior art bonding apparatus causes problems in mounting a semiconductor chip onto a wiring substrate.
Figure 7B:
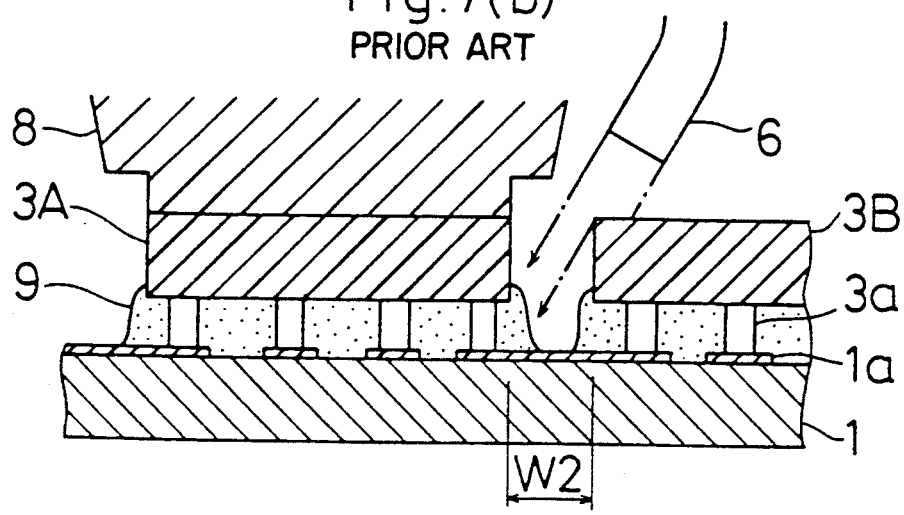
Figure 7C:
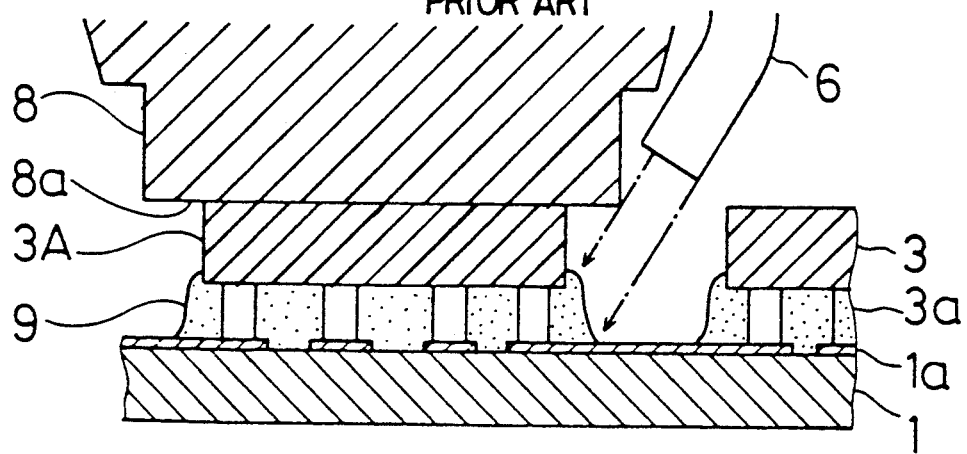

In depressing the semiconductor chip 3 with the depression chip 8, as shown in FIG. 4a, the relative positions of the depression chip 8 and the semiconductor chip 3 are generally so arranged that the sides of the former run parallel with the corresponding sides of the latter, respectively. However, a different arrangement variation from the above may be employed wherein each side of the depression surface 8a is arranged at an angle of 45° to each side of the semiconductor chip 3, as shown in FIG. 4b. With this arrangement, the hardening time for hardening the photo-curing resin 9 is reduced to a half, since the photo-curing resin 9 lying alongside the side faces of the semiconductor 9 is irradiated with light rays from two directions.

The invention claimed is:

1. A bonding apparatus comprising:
   (a) a mounting stand onto which an opaque wiring substrate with wires on its top surface is placed:
   (b) a depression jib for depressing against the wiring substrate a semiconductor chip with bump electrodes on its undersurface, the semiconductor ship being set in place on the wiring substrate that is placed on the mounting stand;
   (c) pressure means for pressurizing the depression jib downward; and
   (d) light feed means for sending out a light ray upon a photo-curing resin having the property of insulation, the photo-curing resin being supplied between the wiring substrate and the semiconductor chip;
   wherein:
     the depression jig has a depression chip of a light ray transmission material and a holder for holding the depression chip;
     the holder has a portion defining a penetration through which the light ray fed by the light feed means vertically passes;
     the top surface of the depression chip is a flat incident surface upon which the light ray which has passed through the penetration is incident; the undersurface of the depression chip is a flat depression surface for depressing the semiconductor chip against the wiring substrate, said flat depression surface being greater in area than the area of the semiconductor chip; and the side surfaces of the depression chip are reflective surfaces so that the light ray which was incident upon the incident surface and has entered the depression chip is reflected from one of the reflective surfaces onto the depression surface, an obtuse angle being formed between the depression surface and each of the reflective surfaces;
   the incident surface and the depression surface of the depression chip are parallel with each other, and the relationship among the angle formed between the depression surface and the reflective surfaces of the depression chip: $\alpha$, the index of refraction of light relative to the light ray transmission material making up the depression chip: $n_1$, and the index of refraction of light relative to a layer outside the depression chip: $n_2$ is that $\sin \alpha > n_2/n_1$;
   one side of the depression surface of the depression chip is greater than one corresponding side of the semiconductor chip by a given length: L, the other sides of the depression surface are greater than the other corresponding sides of the semiconductor chip by the given length: L, respectively, and the relationship among the given length: L, the thickness of the semiconductor chip: t, and the angle formed between the depression surface and an outgoing light ray emitted from the depression surface: $\beta$ is that $L \geq 2g/\tan \beta$; and
   the light feed means hardens the photo-curing resin by sending out the light ray which falls upon the incident surface of the depression chip, enters the depression chip, is emitted out of the depression surface, and reaches the photo-curing resin.

2. The bonding apparatus of claim 1, wherein the light feed means sends out ultra violet rays, and the light ray transmission material is an ultra violet ray transmission material.

3. The bonding apparatus of claim 2, wherein the light ray transmission material is a quartz glass.

4. The bonding apparatus of claim 1, wherein the light feed means is an optical fiber.

5. The bonding apparatus of claim 1, wherein there are provided portions defining four penetrations in the holder in a square formation, and the optical fibers are inserted into the respective penetrations.

6. The bonding apparatus of claim 4, wherein the optical fiber is so arranged that it can move horizontally.

7. The bonding apparatus of claim 4, wherein the optical fiber is so arranged that it can move vertically.

8. The bonding apparatus of claim 1, wherein the wires of the wiring substrate form a wiring pattern such that a plurality of semiconductor substrate chips may be mounted on the wiring substrate.

* * * * *

UNITED STATES PATENT AND TRADEMARK OFFICE
CERTIFICATE OF CORRECTION

PATENT NO. : 5,316,610
DATED : May 31, 1994
INVENTOR(S) : Tomohiro Tamaki et al.

It is certified that error appears in the above-indentified patent and that said Letters Patent is hereby corrected as shown below:

Col. 1, line 46, delete "shows shows" and insert --show--

Col. 4, line 52, delete "Photo-curing" and insert --photo-curing--

Col. 5, line 18, delete "Preferred" and insert --preferred--

Col. 5, line 23, delete "I" and insert --1--

Col. 6, line 19, after "the" insert --high--

Col. 6, line 20, delete "high"

Col. 6, line 67, delete "extends" and insert --extrudes--

Col. 7, line 21, delete "1/2" and insert --180--

Claim 1, col. 8, line 11, delete "jib" and insert --jig--

Claim 1, col. 8, line 13, delete "ship" and insert --chip--

UNITED STATES PATENT AND TRADEMARK OFFICE
CERTIFICATE OF CORRECTION

PATENT NO. : 5,316,610
DATED : May 31, 1994
INVENTOR(S) : Tomohiro Tamaki et al.

It is certified that error appears in the above-indentified patent and that said Letters Patent is hereby corrected as shown below:

Claim 1, col. 8, line 16, delete "jib" and insert --jig--

Claim 1, col. 8, line 63, delete "g" and insert --t--

Claim 1, col. 8, line 64, delete "hardens" and insert --hardening--

Signed and Sealed this

Eighteenth Day of October, 1994

Attest:

BRUCE LEHMAN

Attesting Officer

Commissioner of Patents and Trademarks